United States Patent
Takagi et al.

(10) Patent No.: US 9,502,456 B2
(45) Date of Patent: Nov. 22, 2016

(54) ELECTRONIC COMPONENT DEVICE (71) Applicant: HAMAMATSU PHOTONICS K.K., Hamamatsu-shi, Shizuoka (JP)

(72) Inventors: Shin-ichiro Takagi, Hamamatsu (JP); Shingo Ishihara, Hamamatsu (JP); Masaharu Muramatsu, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/760,258

(22) PCT Filed: Sep. 24, 2013

(86) PCT No.: PCT/JP2013/075706
§ 371 (c)(1),
(2) Date: Jul. 10, 2015

(87) PCT Pub. No.: WO2014/112158
PCT Pub. Date: Jul. 24, 2014

(65) Prior Publication Data
US 2015/0340398 A1  Nov. 26, 2015

(30) Foreign Application Priority Data

Jan. 18, 2013 (JP) ................. 2013-007579

(51) Int. Cl.
*H01L 31/00* (2006.01)
*H01L 27/146* (2006.01)
(Continued)

(52) U.S. Cl.
CPC ..... *H01L 27/14636* (2013.01); *H01L 23/4985* (2013.01); *H01L 23/49838* (2013.01);
(Continued)

(58) Field of Classification Search
CPC .................................. H01L 27/14634
USPC ......................................... 257/459
See application file for complete search history.

(56) References Cited

U.S. PATENT DOCUMENTS

2002/0171155 A1* 11/2002 Fujihira ............... H01L 24/48
257/780

FOREIGN PATENT DOCUMENTS

EP   1 065 712      1/2001
JP   S49-122972 A   11/1974
(Continued)

OTHER PUBLICATIONS

Machine Translation of JP 11-126952.*
(Continued)

*Primary Examiner* — Anthony Ho
(74) *Attorney, Agent, or Firm* — Drinker Biddle & Reath LLP (57) ABSTRACT

An electronic component device includes a first electronic component on which a first electrode pad is disposed, a second electronic component on which a second electrode pad having a first pad portion and a second pad portion is disposed, a first bonding wire having one end connected to the first electrode pad and the other end connected to the first pad portion, and a second bonding wire having one end connected to a connection portion between the first pad portion and the first bonding wire and the other end connected to the second pad portion. The second electrode pad is disposed on the second electronic component so that the first pad portion and the second pad portion are laid along a direction intersecting with an extending direction of the first bonding wire. The extending direction of the first bonding wire intersects with an extending direction of the second bonding wire.

6 Claims, 6 Drawing Sheets (51) Int. Cl.
*H01L 23/498* (2006.01)
*H01L 23/00* (2006.01)

(52) U.S. Cl.
CPC ............... *H01L24/48* (2013.01); *H01L 24/49* (2013.01); *H01L 27/14618* (2013.01); *H01L 27/14634* (2013.01); *H01L 24/45* (2013.01); *H01L 24/85* (2013.01); *H01L 2224/05553* (2013.01); *H01L 2224/05554* (2013.01); *H01L 2224/45144* (2013.01); *H01L 2224/45147* (2013.01); *H01L 2224/48011* (2013.01); *H01L 2224/48091* (2013.01); *H01L 2224/48227* (2013.01); *H01L 2224/48465* (2013.01); *H01L 2224/48997* (2013.01); *H01L 2224/4911* (2013.01); *H01L 2224/49175* (2013.01); *H01L 2224/49429* (2013.01); *H01L 2224/78301* (2013.01); *H01L 2224/85181* (2013.01); *H01L 2224/85207* (2013.01); *H01L 2224/85951* (2013.01); *H01L 2224/85986* (2013.01); *H01L 2924/10161* (2013.01); *H01L 2924/15787* (2013.01); *H01L 2924/19107* (2013.01)

(56) References Cited

FOREIGN PATENT DOCUMENTS

| | | |
|---|---|---|
| JP | S57-096565 | 6/1982 |
| JP | H1-158742 | 6/1989 |
| JP | H07-78953 A | 3/1995 |
| JP | H11-126952 A | 5/1999 |
| JP | 2001-015541 A | 1/2001 |
| JP | 2006-302963 A | 11/2006 |
| JP | 2011-101051 A | 5/2011 |

OTHER PUBLICATIONS

English-language translation of International Preliminary Report on Patentability (IPRP) dated Jul. 30, 2015 that issued in WO Patent Application No. PCT/JP2013/075706.

\* cited by examiner

Fig.6

ELECTRONIC COMPONENT DEVICE

TECHNICAL FIELD

The present invention relates to an electronic component device.

BACKGROUND ART

There is a known electronic component device having a first electronic component on which a first electrode pad is disposed, a second electronic component on which a second electrode pad is disposed, and a bonding wire having one end connected to the first electrode pad and the other end connected to the second electrode pad (e.g., cf. Patent Literature 1).

CITATION LIST

Patent Literature

Patent Literature 1: Japanese Patent Application Laid-open Publication No. 2011-101051

SUMMARY OF INVENTION

Technical Problem

It is conceivable to reinforce a connection portion between the other end of each bonding wire (which will be referred to hereinafter as "first bonding wire") and the second electrode pad by another bonding wire (which will be referred to hereinafter as "second bonding wire") different from the first bonding wire. In this case, one end of the second bonding wire is connected to the foregoing connection portion and the other end of the second bonding wire is connected to the second electrode pad, for example, at a position different from the connection portion.

In implementing the wire bonding between the first electrode pad and the second electrode pad, a leading end of a bonding wire fed out of a capillary is first connected to the first electrode pad. Thereafter, the capillary is moved to the position of the second electrode pad and then the other end of the bonding wire is connected to the second electrode pad. A loop is formed in a predetermined shape in the bonding wire, so as to prevent the bonding wire connected to the first electrode pad and the second electrode pad from coming into contact with the first electronic component and the second electronic component. For forming the loop of the predetermined shape in the bonding wire, the one end of the bonding wire fed out of the capillary is connected to the first electrode pad and thereafter the capillary is once moved in a direction opposite to a direction from the first electrode pad to the second electrode pad.

In the case where the connection portion between the other end of the first bonding wire and the second electrode pad is reinforced by the second bonding wire, if a connection portion of the other end of the second bonding wire is located on an extension of the first bonding wire, the following problem will arise. For forming the aforementioned loop in the second bonding wire, the one end of the second bonding wire is connected to the connection portion and thereafter the capillary is moved in the direction opposite to the direction in which the connection portion of the other end of the second bonding wire is located. At this time, the capillary may come into contact with the first bonding wire. In order to prevent the capillary from coming into contact with the first bonding wire, the second bonding wire needs to be connected to the second electrode pad so as not to locate the connection portion of the other end of the second bonding wire on the extension of the first bonding wire.

For not locating the connection portion of the other end of the second bonding wire on the extension of the first bonding wire, it is necessary to increase the area of the second electrode pad so as to secure a space for connection of the second bonding wire. However, the increase in the area of the second electrode pad may cause interference of the second electrode pad with another conductive portion (e.g., an electrode pad or the like) located around the second electrode pad. For avoiding the interference of the second electrode pad with the other conductive portion, the arrangement distance (pitch) of the second electrode pad and the other conductive portion has to be changed. As a consequence, the size of the electronic component becomes larger.

The present invention has been accomplished in view of the above-described circumstances and it is an object of the present invention to provide an electronic component device allowing the connection portion between the bonding wire and electrode pad to be reinforced, while suppressing the increase in the size of the electronic component.

Solution to Problem

One aspect of the present invention is an electronic component device includes a first electronic component on which a first electrode pad is disposed, a second electronic component on which a second electrode pad having a first pad portion and a second pad portion is disposed, a first bonding wire having one end connected to the first electrode pad and the other end connected to the first pad portion, and a second bonding wire having one end connected to a connection portion between the first pad portion and the first bonding wire and the other end connected to the second pad portion. The second electrode pad is disposed on the second electronic component so that the first pad portion and the second pad portion are laid along a direction intersecting with an extending direction of the first bonding wire. The extending direction of the first bonding wire intersects with an extending direction of the second bonding wire.

In the present invention, the first pad portion and second pad portion of the second electrode pad are laid along the direction intersecting with the extending direction of the first bonding wire. This arrangement reduces the area of the second electrode pad in the direction intersecting with the extending direction of the first bonding wire, while the second electrode pad has the second pad portion connected to the other end of the second bonding wire. When the area of the second electrode pad is reduced, the arrangement distance to the other conductive portion is set relatively narrow. Namely, there is no need for largely changing the arrangement distance to the other conductive portion, in order to avoid the interference with the other conductive portion located around the second electrode pad. As a result, it is feasible to reinforce the connection portion between the bonding wire and the electrode pad, while suppressing the increase in the size of the electronic component.

The second electrode pad may further have a third pad portion coupling the first pad portion and the second pad portion to each other, and the third pad portion may extend along the direction intersecting with the extending direction of the first bonding wire. In this case, the areas of the first pad portion and the second pad portion are set relatively wide and thus it becomes easier to implement wire connections to the respective pad portions.

The first electronic component may be a solid-state imaging device which has one principal surface and which has a plurality of first electrode pads arranged along one side of the one principal surface. The second electronic component may have an edge opposed to the one side and have a plurality of second electrode pads arranged along the edge. The electronic component device may include a plurality of first bonding wires each of which connects the corresponding first electrode pad and first pad portion of the second electrode pad and a plurality of second bonding wires each of which connects the corresponding first pad portion and second pad portion. In this case, though each second electrode pad has the second pad portion to which the other end of the second bonding wire is connected, the area of each second electrode pad is reduced in the direction intersecting with the extending direction of the first bonding wire.

In each second electrode pad, the first pad portion may be located nearer to the edge than the second pad portion is.

In each second electrode pad, the second pad portion may be located nearer to the edge than the first pad portion is.

The plurality of second electrode pads may include: a plurality of second electrode pads each of which is disposed so that the first pad portion and the second pad portion are laid along a first direction intersecting with the extending direction of the first bonding wire and which are disposed in parallel to each other; and a plurality of second electrode pads each of which is disposed so that the first pad portion and the second pad portion are laid along a second direction intersecting with the extending direction of the first bonding wire and with the first direction and which are disposed in parallel to each other.

The second electronic component may be a flexible wiring board.

Advantageous Effect of Invention

The present invention has provided the electronic component device allowing the connection portion between the bonding wire and electrode pad to be reinforced, while suppressing the increase in the size of the electronic component.

DESCRIPTION OF EMBODIMENTS

Preferred embodiments of the present invention will be described below in detail with reference to the accompanying drawings. Identical elements or elements with identical functionality will be denoted by the same reference signs in the description, without redundant description.

Figure 1:
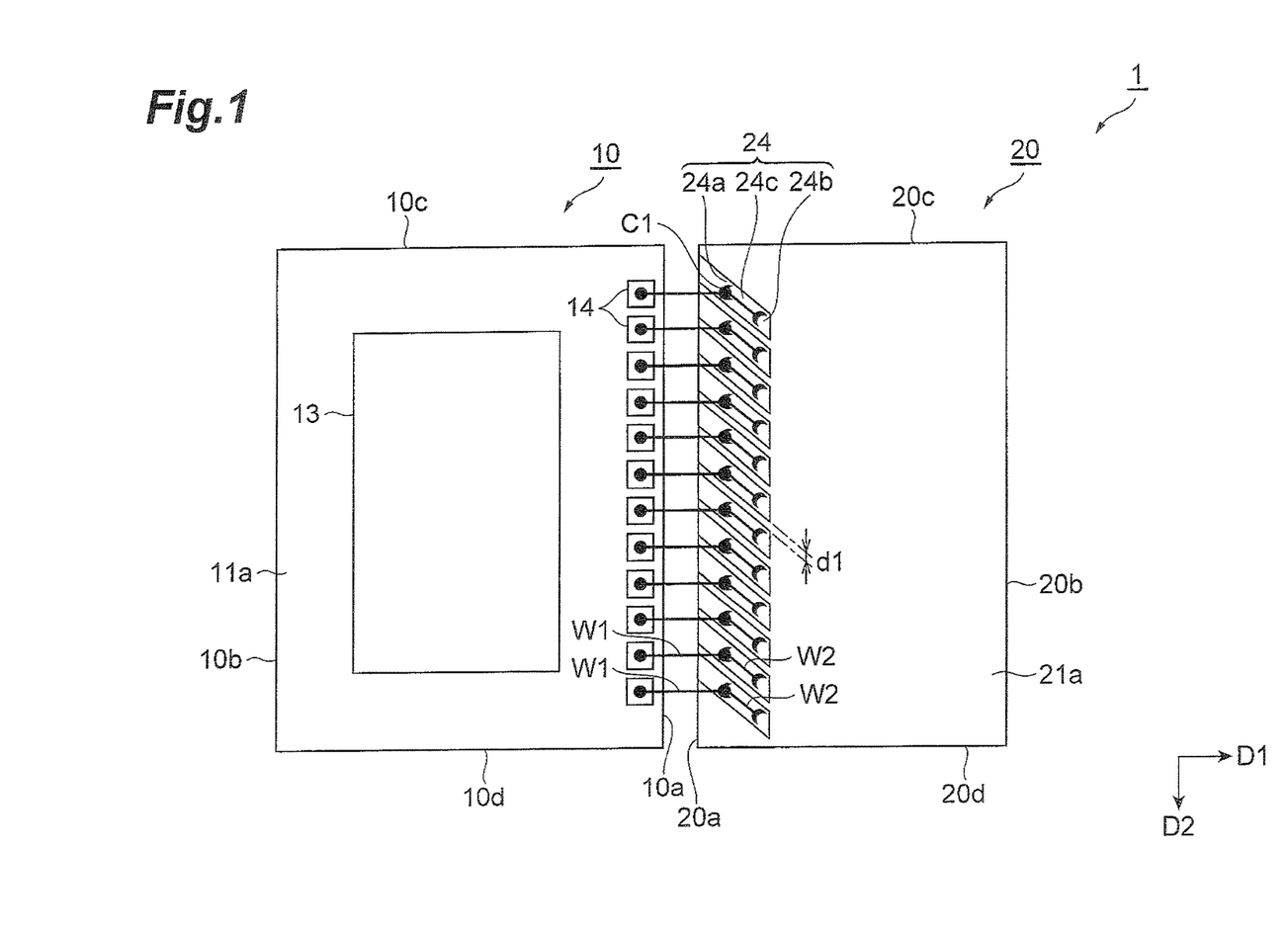
FIG. 1 is a thawing showing a configuration of an electronic component device according to an embodiment of the present invention.
Figure 2:
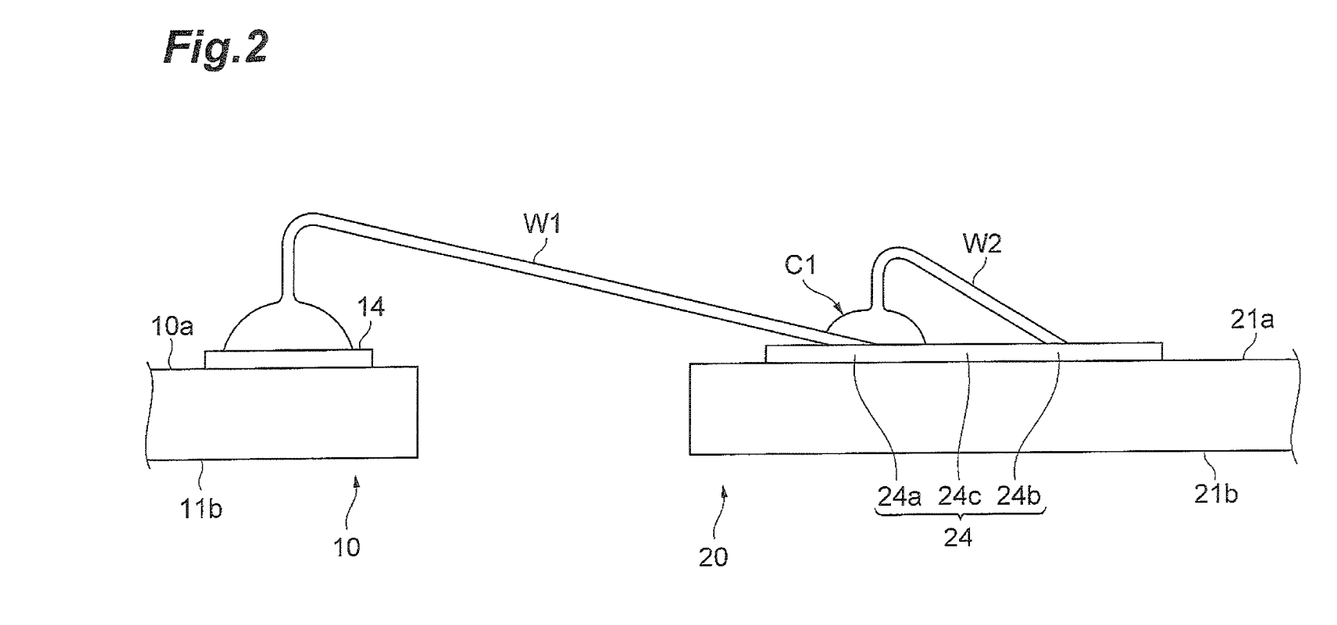
FIG. 2 is a drawing for explaining a cross-sectional configuration of the electronic component device according to the embodiment.

First, the configuration of the electronic component device 1 according to the embodiment of the invention will be described with reference to FIG. 1 and FIG. 2. FIG. 1 is a drawing showing the configuration of the electronic component device according to the present embodiment. FIG. 2 is a drawing showing the cross-sectional configuration of the electronic component device according to the present embodiment. The electronic component device 1 has a first electronic component 10, a second electronic component 20, first bonding wires W1, and second bonding wires W2, as shown in FIGS. 1 and 2. In the present embodiment, the first electronic component 10 is a solid-state imaging device and the second electronic component 20 a wiring board.

The first electronic component 10 is a multi-port solid-state imaging device. In the multi-port solid-state imaging device, an imaging area to generate an electric charge according to an amount of incident light is divided into a plurality of imaging segments and output portions are disposed for the respective divided imaging segments. Electric charges generated in the divided imaging segments are read out and then output by the corresponding output portions. The multi-port solid-state imaging device is described, for example, in Japanese Patent Application Laid-open Publication No, 2002-170947, Japanese Patent Application Laid-open Publication No. H06-165039 (Japanese Patent No. 3241828), and so on and is known in the pertinent technical fields. For this reason, further detailed description is omitted herein about the multi-port solid-state imaging device.

The first electronic component 10 has a rectangular shape on the plan view thereof and has four sides 10a to 10d constituting the edges of the first electronic component 10. The first electronic component 10 includes a pair of principal surfaces 11a, 11b. The first electronic component 10 has a photosensitive area (imaging area) 13 disposed on the principal surface 11a side. In the first electronic component 10, the principal surface 11a side is defined as a light receiving surface side. FIG. 1 is the plan view obtained when the first electronic component 10 is viewed from the light receiving surface (principal surface 11a) side.

The first electronic component 10 has a plurality of first electrode pads 14. The first electrode pads 14 are located on the principal surface 11a and outside the photosensitive area 13. The first electrode pads 14 are arranged on a line along one side 10a, in the region outside the photosensitive area 13. Each first electrode pad 14 is connected to the corresponding output portion through a wire (not shown). The first electrode pads 14 have a rectangular shape. In the present embodiment, there are twelve first electrode pads 14 arranged.

The second electronic component 20 is a wiring board, such as a ceramic substrate or a flexible printed circuit board (FPC), having wires on the surface or inside thereof. The second electronic component 20 has four sides 20a to 20d constituting the edges of the second electronic component 20. The second electronic component 20 includes a pair of principal surfaces 21a, 21b opposed to each other. The second electronic component 20 has a plurality of second electrode pads (twelve second electrode pads in the present embodiment) 24. One side 20a of the second electronic component 20 is opposed to the one side 10a of the first electronic component 10. The second electrode pads 24 are arranged on a line along the one side 20a on the principal surface 21a of the second electronic component 20. A wire (not shown) is connected to each second electrode pad 24.

Each of the second electrode pads 24 has a first pad portion 24a, a second pad portion 24b, and a third pad portion 24c. The third pad portion 24c couples the first pad portion 24a and the second pad portion 24b to each other. Each second electrode pad 24 is arranged with an arrangement distance d1 to another in a direction D2 perpendicular to an extending direction D1 of the first bonding wire W1.

Each first bonding wire W1 is connected to the corresponding first electrode pad 14 and second electrode pad 24. One end of each first bonding wire W1 is connected to the first electrode pad 14 while the other end of each first bonding wire W1 is connected to the first pad portion 24a. Each first bonding wire W1 is disposed so as to extend in the direction D1. The extending direction D1 of the first bonding wire W1 intersects with the one side 10a of the first electronic component 10 and with the one side 20a of the second electronic component 20. In the present embodiment, the extending direction D1 of the first bonding wire W1 is approximately perpendicular to each of the sides 10a, 20a.

The connection between the one end of the first bonding wire W1 and the first electrode pad 14 is implemented by ball bonding. First, the one end of the first bonding wire W1 is melted to form a wire ball at the one end. Thereafter, under application of heat or ultrasonic, the wire ball is pressed against the first electrode pad 14. It results in ball-bonding the one end of the first bonding wire W1 to the first electrode pad 14.

The connection between the other end of the first bonding wire W1 and the first pad portion 24a is implemented by stitch bonding. First, the other end of the first bonding wire W1 is pressed against the first pad portion 24a by the edge part of the leading end of the capillary and then heat or ultrasonic is applied thereto to connect the first bonding wire W1 to the first pad portion 24a. Thereafter, the first bonding wire W1 is cut (or stitched). It results in stitch-bonding the other end of the first bonding wire W1 to the first pad portion 24a.

Each second bonding wire W2 is connected to the second electrode pad 24. One end of the second bonding wire W2 is connected to a connection portion C1 to the first bonding wire W1 on the first pad portion 24a and the other end of the second bonding wire W2 is connected to the second pad portion 24b.

The connection between the one end of the second bonding wire W2 and the first pad portion 24a is implemented by ball bonding. First, the one end of the second bonding wire W2 is melted to form a wire ball at the one end. Thereafter, under application of heat or ultrasonic, the wire ball is pressed against the connection portion C1. It results in ball-bonding the one end of the second bonding wire W2 to the first pad portion 24a.

The connection between the other end of the second bonding wire W2 and the second pad portion 24b is implemented by stitch bonding. First, the other end of the second bonding wire W2 is pressed against the second pad portion 24b by the edge part of the leading end of the capillary and then heat or ultrasonic is applied thereto to connect the second bonding wire W2 to the second pad portion 24b. Thereafter, the second bonding wire W2 is cut (or stitched). It results in stitch-bonding the other end of the second bonding wire W2 to the second pad portion 24b.

The extending direction of the second bonding wire W2 intersects with the extending direction D1 of the first bonding wire W1. Namely, each second bonding wire W2 is disposed so as to extend in the direction intersecting with the extending direction D1 of the first bonding wire W1. The first bonding wires W1 and second bonding wires W2 are comprised of a metal material such as gold or copper.

The present embodiment is so configured that in each second electrode pad 24 the first pad portion 24a is located nearer to the one side 20a than the second pad portion 24b is. Each second electrode pad 24 is so disposed that the first pad portion 24a and second pad portion 24b are laid along the direction intersecting at a predetermined first angle to the extending direction D1 of the first bonding wire W1. The third pad portion 24c extends in the direction intersecting at the first angle to the extending direction D1 of the first bonding wire W1. Namely, in the second electrode pad 24, the first pad portion 24a, the third pad portion 24c, and the second pad portion 24b are located in the order of the first pad portion 24a, the third pad portion 24c, and the second pad portion 24b from the side near to the one side 20a so as to be laid along the direction intersecting at the first angle to the extending direction D1 of the first bonding wire W1. The second electrode pad 24 has a parallelogram shape with one side forming a part of the one side 20a and extends along the extending direction of the second bonding wire W2. The first electrode pads 14 and the second electrode pads 24 are made of an electroconductive material such as metal by a method such as printing or sputtering. In the present embodiment, the foregoing first angle is set approximately to 135°.

In the present embodiment, the arrangement distance of the first electrode pads 14 and the arrangement distance d1 of the second electrode pads 24 are set approximately equal. The corresponding first electrode pad 14 and first pad portion 24a of the second electrode pad 24 are opposed to each other in the direction approximately perpendicular to each of the sides 10a, 20a. The lengths of the respective first bonding wires W1 connecting the corresponding first electrode pads 14 and first pad portions 24a are approximately equal to each other.

In the present embodiment, the corresponding first electrode pads 14 and first pad portions 24a are electrically connected in a one-to-one relation by the first bonding wires W1. A signal output to each first electrode pad 14 is fed through the first bonding wire W1 and the second electrode pad 24 to the wire connected to the second electrode pad 24. The first pad portion 24a and the second pad portion 24b in an identical second electrode pad 24 are electrically connected by the third pad portion 24c and the second bonding wire W2.

Figure 6:
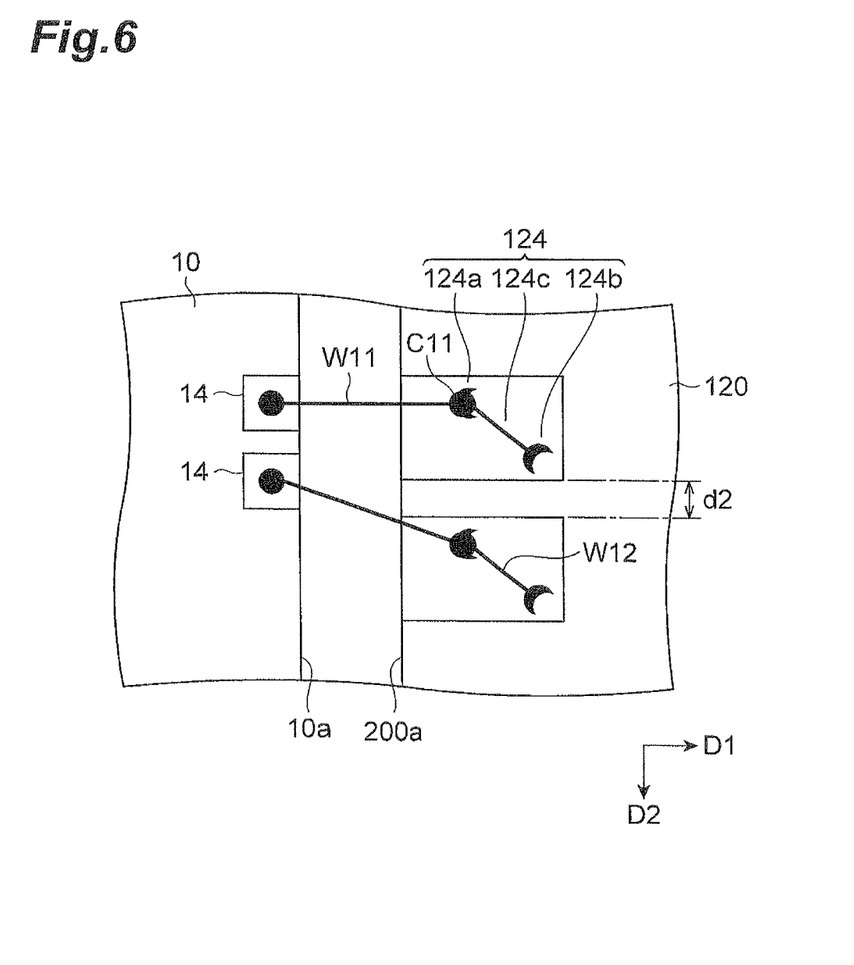
FIG. 6 is a drawing showing a configuration of an electronic component device disclosed as a comparative example.

The below will describe the electronic component device disclosed as a comparative example. FIG. 6 is a drawing showing the configuration of the electronic component device disclosed as the comparative example. The electronic component device as the comparative example, as shown in FIG. 6, has the first electronic component 10 on which the plurality of first electrode pads 14 are disposed, a second electronic component 120 on which a plurality of second electrode pads 124 are disposed, a plurality of first bonding wires W11, and a plurality of second bonding wires W12.

Each second electrode pad 124 has a first pad portion 124a, a second pad portion 124b, and a third pad portion 124c. The third pad portion 124c couples the first pad portion 124a and the second pad portion 124b to each other. Each second electrode pad 124 is arranged with an arrangement distance d2 to another in a direction D2 perpendicular to the extending direction D1 of one first bonding wire W11.

One end of each first bonding wire W11 is connected to the first electrode pad 14 while the other end of each first bonding wire W11 is connected to the second electrode pad 124. One end of each second bonding wire W12 is connected to the first pad portion 124a while the other end of each second bonding wire W12 is connected to the second pad portion 124b. A connection C11 between the other end of the first bonding wire W11 and the first pad portion 124a is reinforced by the second bonding wire W12. In the electronic component device as the comparative example, the second electrode pad 124 is expanded in the extending direction D1 of one first bonding wire W11 and in the direction D2 perpendicular to the direction D1, in order to secure the space for connection of the other end of the second bonding wire W12, in the second electrode pad 124 (second pad portion 124b). For this reason, the area of the second electrode pad 124 becomes significantly larger.

When the area of the second electrode pad 124 is significantly larger, it results in increasing the areas of mutually opposed regions in the second electrode pad 124 and in the conductive portion disposed in the second electronic component 120. For this reason, it increases the capacitive component composed of the mutually opposed regions. As a consequence, it causes degradation of noise characteristics and high-frequency characteristics of signals send from the first electronic component 10, so as to affect the characteristics of the electronic component device.

When the area of the second electrode pad 124 is expanded in the direction D2 perpendicular to the extending direction D1 of one first bonding wire W11 as in the electronic component device shown in FIG. 6, it becomes necessary to set the arrangement distance d2 smaller. For this reason, a short circuit is likely to occur between adjacent second electrode pads 124. It is conceivable to widen the arrangement distance d2 of the second electrode pads 124, in order to prevent the short circuit from occurring between adjacent second electrode pads 124. In this case, the size of the second electronic component 120 becomes unnecessarily larger.

In contrast to it, the present embodiment is configured, as described above, so that the second electrode pad 24 has the first pad portion 24a and the second pad portion 24b laid along the direction intersecting at the predetermined first angle (135° in the present embodiment) to the extending direction D1 of the first bonding wire W1. For this reason, although each second electrode pad 24 has the second pad portion 24b to which the other end of the second bonding wire W2 is connected, the area of each second electrode pad 24 is reduced in the foregoing direction intersecting with the extending direction D1 of the first bonding wire W1.

Since the area of each second electrode pad 24 is reduced in the foregoing direction intersecting with the extending direction D1 of the first bonding wire W1, the distance to the other conductive portion is set relatively narrow. Namely, the present embodiment does not have to largely change the arrangement distance d1 of the second electrode pads 24 in the direction D2 perpendicular to the extending direction D1 of the first bonding wire W1, for avoiding the interference between adjacent second electrode pads 24. For this reason, the connection portion C1 between the first bonding wire W1 and the first pad portion 24a can be reinforced, while suppressing the increase in the size of the electronic component device 1.

Since the area of the second electrode pad 24 is reduced as described above, the areas of the mutually opposed regions are relatively small in the second electrode pad 24 and in the conductive portion disposed in the second electronic component 20. For this reason, it is feasible to suppress the increase in the capacitive component composed of the mutually opposed regions.

When the area of the second electrode pad 24 is reduced in the foregoing direction intersecting with the extending direction D1 of the first bonding wire W1, there is no reduction in the arrangement distance d1 of the second electrode pads 24 in the direction D2 perpendicular to the extending direction D1 of the first bonding wire W1. For this reason, it is also feasible to prevent a short circuit from occurring between adjacent second electrode pads 24.

The connection between the other end of the first bonding wire W1 and the first pad portion 24a is implemented by stitch bonding. Namely, without forming a wire ball in the first bonding wire W1, the connection between the other end of the first bonding wire W1 and the first pad portion 24a is made by pressing the other end of the first bonding wire W1 against the first pad portion 24a. For this reason, the connection portion C1 between the other end of the first bonding wire W1 and the first pad portion 24a has the connection strength relatively weak. The connection portion C1 between the other end of the first bonding wire W1 and the first pad portion 24a is reinforced by the second bonding wire W2, so as to enhance the connection strength at the connection portion C1, whereby the electronic component device 1 becomes suitable for practical use.

In the second electrode pad 24, the first pad portion 24a is located nearer to the side 20a than the second pad portion 24b is. For this reason, the wire bonding to each second electrode pad 24 can be readily implemented in the case where the second electronic component 20 is a ceramic substrate the edges of which are approximately flat on the principal surface 11a and which is made of a relatively hard material.

The lengths of the respective first bonding wires W1 connecting the corresponding first electrode pads 14 and second electrode pads 24 are approximately equal. For this reason, it is feasible to reduce occurrence of variation in signals sent between the first electrode pads 14 and the second electrode pads 24 connected by the first bonding wires W1.

The preferred embodiment of the present invention was described above and it should be noted that the present invention is not always limited to the above-described embodiment but can be modified in many ways without departing from the spirit and scope of the invention.

Figure 3:
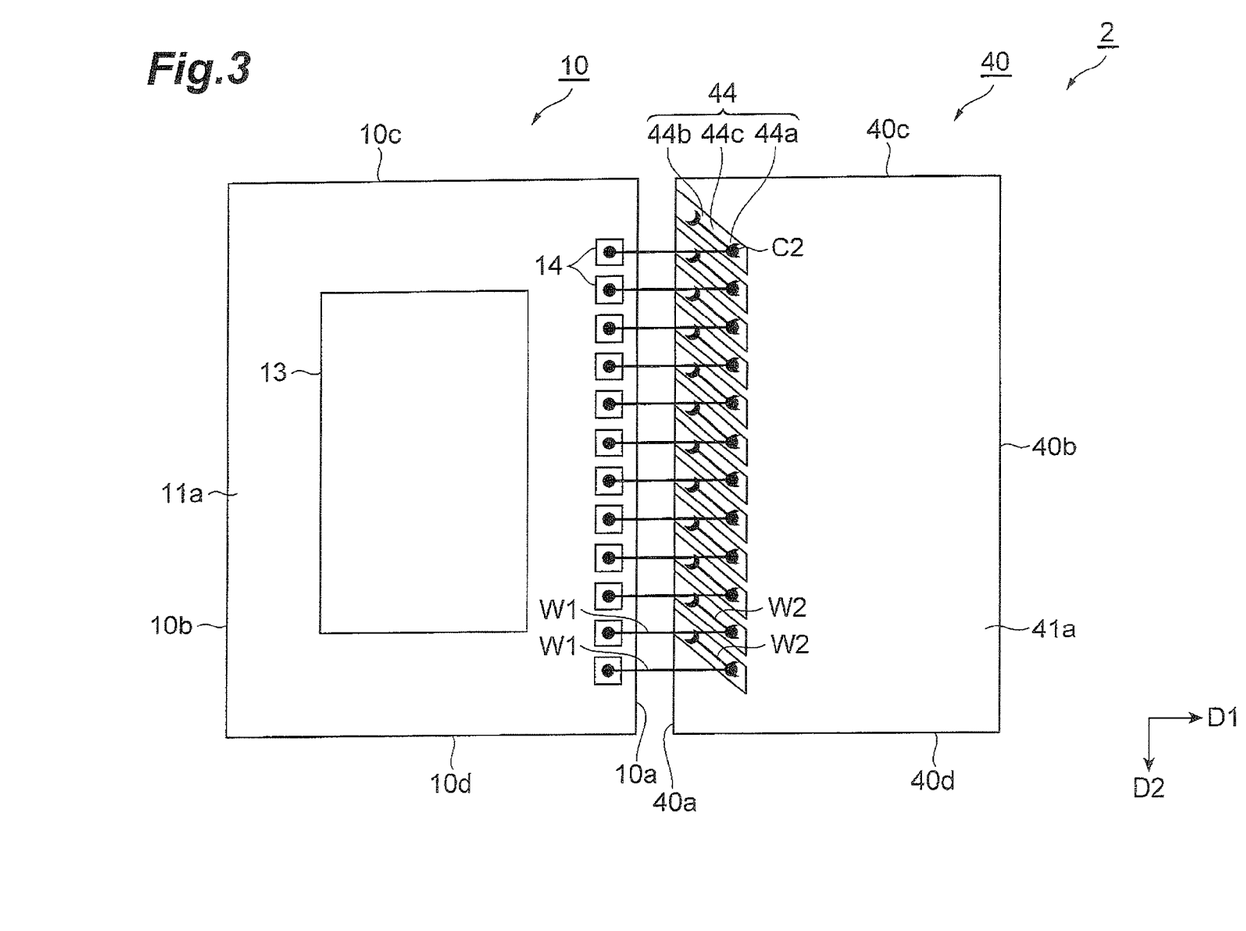
FIG. 3 is a drawing showing a configuration of an electronic component device according to a modification example of the embodiment.
Figure 4:
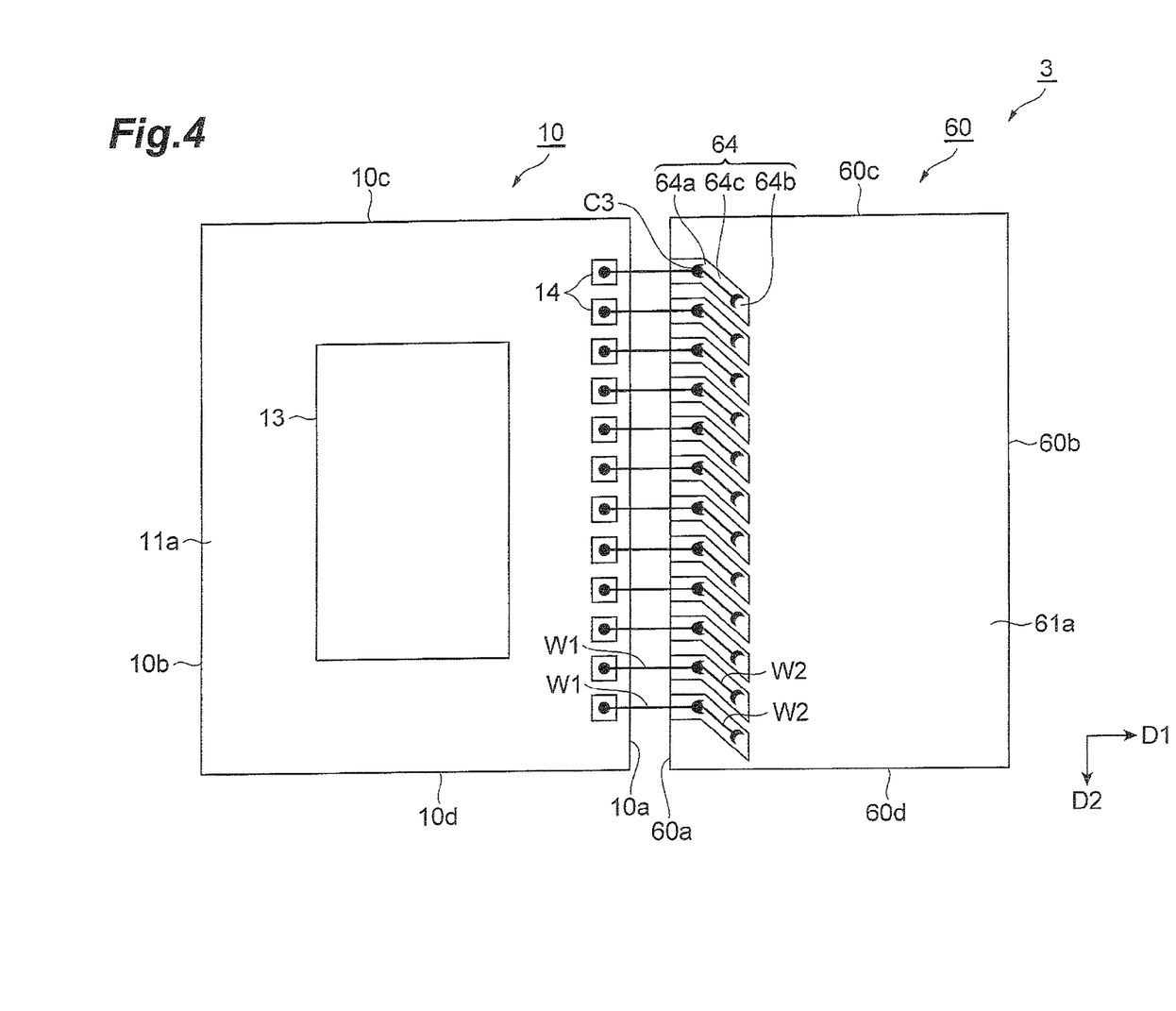
FIG. 4 is a drawing showing a configuration of an electronic component device according to another modification example of the embodiment.
Figure 5:
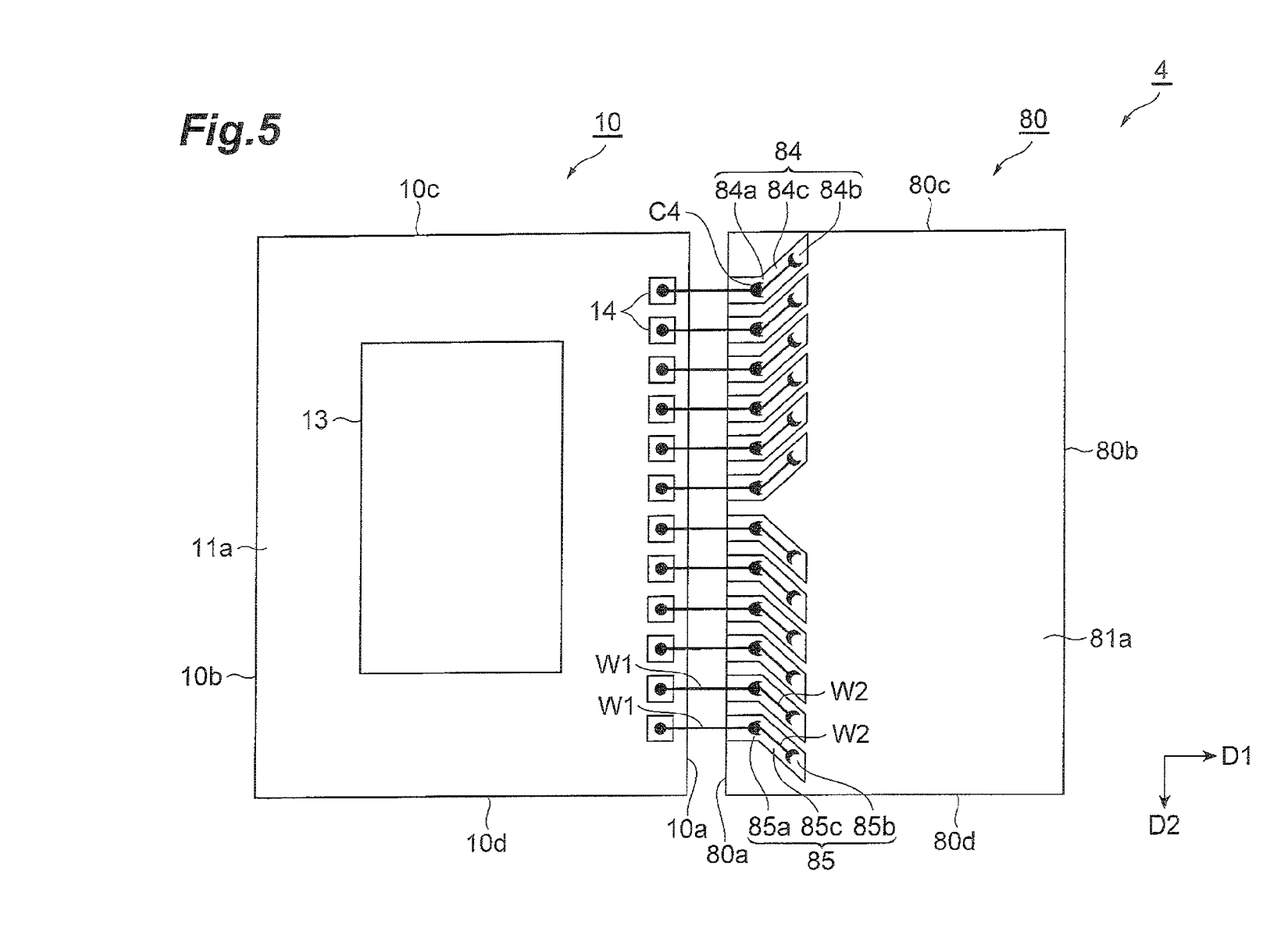
FIG. 5 is a drawing showing a configuration of an electronic component device according to another modification example of the embodiment.

The configurations of electronic component devices 2 to 4 according to modification examples of the embodiment will be described with reference to FIGS. 3 to 5. FIGS. 3 to 5 are drawings showing the configurations of the electronic component devices according to the modification examples of the embodiment. In the second electrode pad 24, the first pad portion 24a is located nearer to the one side 20a than the second pad portion 24b is, but the configuration of the second electrode pad 24 does not have to be limited to it. Like the second electronic component 40 in the electronic component device 2 shown in FIG. 3, the arrangement of the first pad portion 24a and the second pad portion 24b may be reverse to the arrangement in the second electronic component 20. Namely, in each second electrode pad 44 disposed on a principal surface 41a of the second electronic component 40, a second pad portion 44b is located nearer to one side 40a than a first pad portion 44a is. The second electronic component 40 has four sides 40a to 40d constituting the edges of the second electronic component 40. Each second electrode pad 44 has the first pad portion 44a, the second pad portion 44b, and a third pad portion 44c. The first pad portion 44a, the second pad portion 44b, and the third pad portion 44c are located in the order of the second pad portion 44b, the third pad portion 44c, and the first pad portion 44a from the one side 40a side. A connection portion C2 between the other end of the first bonding wire W1 and the first pad portion 44a is reinforced by the second bonding wire W2.

The second electronic component 40 is a flexible wiring board. When the flexible wiring board is cut into a product size, the edges thereof can be curved in such a manner that the principal surface 41a with the second electrode pads 24 being arranged thereon is an outside surface of curvature. When the edges of the flexible wiring board are curved in this manner, it is difficult to implement the wire bonding to the electrode pads disposed at the edge of the principal surface 41a. When the second pad portion 44b is located nearer to the one side 40a than the first pad portion 44a is located in the second electrode pad 44, as shown in FIG. 3, the connection portion C2 between the other end of the first bonding wire W1 and the first pad portion 44a is located relatively apart from the edge of the principal surface 41a. It can further enhance the connection strength at the connection portion C2 between the other end of the first bonding wire W1 and the first pad portion 44a.

The capillary generally has the leading end with a cross section of a V-tapered shape. The edges of the flexible wiring board are curved as described above. For these reasons, when the capillary is moved from the vicinity of the first pad portion 44a toward the second pad portion 44b, the other end of the second bonding wire W2 can be pressed against the second pad portion 44b in a state in which the tapered surface of the leading end of the capillary is kept approximately parallel to the edge of the principal surface 41a of the second electronic component 40. Therefore, it is feasible to enhance the connection strength between the other end of the second bonding wire W2 and the second pad portion 44b.

In the second electronic component 20, the second electrode pads 24 have the parallelogram shape, but the shape thereof does not have to be limited to the parallelogram. Like the second electronic component 60 in the electronic component device 3 shown in FIG. 4, each second electrode pad 64 may have a portion extending along the extending direction D1 of the first bonding wire W1, at a position nearer to one side 60a with respect to a first pad portion 64a. The second electronic component 60 has four sides 60a to 60d constituting the edges of the second electronic component 60. Each second electrode pad 64 disposed on the principal surface 61a of the second electronic component 60 has the first pad portion 64a, a second pad portion 64b, and a third pad portion 64c. The first pad portion 64a, the second pad portion 64b, and the third pad portion 64c are located in the order of the first pad portion 64a, third pad portion 64c, and second pad portion 64b from the one side 60a side. A connection portion C3 between the other end of the first bonding wire W1 and the first pad portion 64a is reinforced by the second bonding wire W2.

In the second electronic component 20, all the second electrode pads 24 are laid along the same direction but they do not have to be limited to this arrangement. As shown in FIG. 5, the second electronic component 80 in the electronic component device 4 may have a plurality of second electrode pads 84 and a plurality of second electrode pads 85 disposed in respective directions different from each other. The second electrode pads 84 and the second electrode pads 85 are disposed on a principal surface 81a of the second electronic component 80. The second electronic component 80 has four sides 80a to 80d constituting the edges of the second electronic component 80.

Each second electrode pad 84 has a first pad portion 84a, a second pad portion 84b, and a third pad portion 84c. The first pad portion 84a, the second pad portion 84b, and the third pad portion 84c are located in the order of the first pad portion 84a, the third pad portion 84c, and the second pad portion 84b from the one side 80a side. The plurality of second electrode pads 84 are disposed in parallel to each other. In each second electrode pad 84, the first pad portion 84a, third pad portion 84c, and second pad portion 84b are arranged along a first direction intersecting with the extending direction D1 of the first bonding wire W1. Each second electrode pad 85 has a first pad portion 85a, a second pad portion 85b, and a third pad portion 85c. The first pad portion 85a, the second pad portion 85b, and the third pad portion 85c are located in the order of the first pad portion 85a, the third pad portion 85c, and the second pad portion 85b from the one side 80a side. The plurality of second electrode pads 85 are disposed in parallel to each other. In each second electrode pad 85, the first pad portion 85a, third pad portion 85c, and second pad portion 85b are arranged along a second direction intersecting with the extending direction D1 of the first bonding wire W1 and with the foregoing first direction. In this case, for example, the wires connected to the respective second electrode pads 84 and the wires connected to the respective second electrode pads 85 can be disposed separately in two regions on the principal surface 81a of the second electronic component 80. It can enhance degrees of freedom for routing of wiring patterns in the second electronic component 80. A connection portion C4 between the other end of the first bonding wire W2 and each first pad portion 84a or 85a is reinforced by the second bonding wire W2.

In the above-described embodiment and modification examples, the connection between the one end of the first bonding wire W1 and the first electrode pad 14 is implemented by ball bonding and the connection between the other end of the first bonding wire W1 and the first pad portion 24a, 44a, 64a, 84a, or 85a is implemented by stitch bonding. The connection between the one end of the second bonding wire W2 and the first pad portion 24a, 44a, 64a, 84a, or 85a is implemented by ball bonding and the connection between the other end of the second bonding wire W2 and the second pad portion 24b, 44b, 64b, 84b, or 85b is implemented by stitch bonding. However, these connections do not have to be limited to the above-described bonding methods.

The numbers of the first and second electrode pads 14, 24, 44, 64, 84, 85 do not have to be limited to those disclosed in the foregoing embodiment and modification examples. The first and second electrode pads 14, 24, 44, 64, 84, or 85 do not have to be disposed on a line, but may be disposed in a zigzag pattern.

INDUSTRIAL APPLICABILITY

The present invention is applicable to the electronic component apparatus having the solid-state imaging device and the wiring board to which the solid-state imaging device is connected.

REFERENCE SIGNS LIST 1-4 electronic component devices; 10 first electronic component; 11a, 11b principal surfaces; 20a-20d, 40a-40d, 60a-60d, 80a-80d sides; 13 photosensitive area; 14 first electrode pads; 20, 40, 60, 80 second electronic components; 21a, 21b, 41a, 61a, 81a principal surfaces; 24, 44, 64, 84, 85 second electrode pads; 24a, 44a, 64a, 84a, 85a first pad portions; 24b, 44b, 64b, 84b, 85b second pad portions; 24c, 44c, 64c, 84c, 85c third pad portions; C1-C4 connection portions between first pad portions and first bonding wires; D1 extending direction of first bonding wires; W1 first bonding wires; W2 second bonding wires.

The invention claimed is:

1. An electronic component device comprising:
   a first electronic component on which a first electrode pad is disposed;
   a second electronic component on which a second electrode pad having a first pad portion and a second pad portion is disposed;
   a first bonding wire having one end connected to the first electrode pad and the other end connected to the first pad portion; and
   a second bonding wire having one end connected to a connection portion between the first pad portion and the first bonding wire and the other end connected to the second pad portion,
   wherein the second electrode pad is disposed on the second electronic component so that the first pad portion and the second pad portion are laid along a direction intersecting with an extending direction of the first bonding wire,
   wherein the extending direction of the first bonding wire intersects with an extending direction of the second bonding wire,
   wherein the first electronic component is a solid-state imaging device which has one principal surface and which has a plurality of said first electrode pads arranged along one side of the one principal surface,
   wherein the second electronic component has an edge opposed to the one side and has a plurality of said second electrode pads arranged along the edge, and
   wherein the electronic component device comprises:
   a plurality of said first bonding wires each of which connects the corresponding first electrode pad and first pad portion of the second electrode pad; and
   a plurality of said second bonding wires each of which connects the corresponding first pad portion and second pad portion.

2. The electronic component device according to claim 1, wherein the second electrode pad further has a third pad portion coupling the first pad portion and the second pad portion to each other, and
   wherein the third pad portion extends along the direction intersecting with the extending direction of the first bonding wire.

3. The electronic component device according to claim 1, wherein in each said second electrode pad, the first pad portion is located nearer to the edge than the second pad portion is.

4. The electronic component device according to claim 1, wherein in each said second electrode pad, the second pad portion is located nearer to the edge than the first pad portion is.

5. The electronic component device according to claim 1, wherein the plurality of second electrode pads include:
   a plurality of said second electrode pads each of which is disposed so that the first pad portion and the second pad portion are laid along a first direction intersecting with the extending direction of the first bonding wire and which are disposed in parallel to each other; and
   a plurality of said second electrode pads each of which is disposed so that the first pad portion and the second pad portion are laid along a second direction intersecting with the extending direction of the first bonding wire and with the first direction and which are disposed in parallel to each other.

6. The electronic component device according to claim 1, wherein the second electronic component is a flexible wiring board.

* * * * *